(12) United States Patent
Borden

(10) Patent No.: US 7,517,709 B1
(45) Date of Patent: Apr. 14, 2009

(54) METHOD OF FORMING BACKSIDE POINT CONTACT STRUCTURES FOR SILICON SOLAR CELLS

(75) Inventor: Peter Borden, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/941,253

(22) Filed: Nov. 16, 2007

(51) Int. Cl.
*H01L 21/00* (2006.01)
*H01L 31/00* (2006.01)
(52) U.S. Cl. .................................. 438/19; 136/256
(58) Field of Classification Search .................... 438/19; 136/256
See application file for complete search history.

(56) References Cited

U.S. PATENT DOCUMENTS

| | | |
|---|---|---|
| 6,429,037 B1 * | 8/2002 | Wenham et al. ............... 438/57 |
| 6,524,880 B2 | 2/2003 | Moon et al. |
| 6,982,218 B2 | 1/2006 | Preu et al. |
| 7,335,555 B2 * | 2/2008 | Gee et al. ................... 438/253 |
| 2006/0060238 A1 * | 3/2006 | Hacke et al. ................. 136/256 |
| 2008/0169468 A1 * | 7/2008 | Ahn ............................ 257/49 |

\* cited by examiner

*Primary Examiner*—W. David Coleman
(74) *Attorney, Agent, or Firm*—Fulbright & Jaworski, LLC

(57) ABSTRACT

A method for fabricating point contacts to the rear surface of a silicon solar cell by coating the rear surface with a masking layer and a laser absorptive layer and directing laser radiation to the rear surface to form openings therein after which doping material is applied through the openings and contacts are applied. The doping is preferably performed by plasma immersion ion implantation.

20 Claims, 3 Drawing Sheets

METHOD OF FORMING BACKSIDE POINT CONTACT STRUCTURES FOR SILICON SOLAR CELLS

FIELD OF THE INVENTION

The present invention relates to silicon solar cells and more particularly to a method for forming point contacts on the rear surface of a silicon solar cell.

DESCRIPTION OF THE PRIOR ART

Solar cells require back contacts. Such contacts have been formed utilizing techniques in the prior art including screen printing. In this technique an aluminum paste or the like is printed through a screen over the rear surface of the silicon substrate and then in a high temperature step, 700 to 800° C., an electrical contact is formed.

It is well known that the highest efficiency, silicon solar cells formed from single crystal silicon or micro crystal silicon are formed having point contact structures on the rear surface thereof, as opposed to a blanket contact over the entire surface. A prior technique for forming these contacts is through the utilization of photolithography. Utilizing this technique a passivating dielectric layer such as silicon dioxide is applied and then by the utilization of well known photo etch resist techniques the dielectric layer is patterned providing openings therein. After removal of the etching resist the rear side contact is accomplished for example by vapor deposition of the desired metal. This is a comparatively expensive technique and is considered undesirable for mass production of solar cells.

A further embodiment utilizing photolithography is the application of a locally high doping level by various known processes among the contacts after which diffusion of the doping substance is accomplished to form the desired high doping regions to which metal contact can then be made, for example, by vapor deposition of the desire metal.

An additional technique which is utilized in the prior art is to apply the passivating dielectric coating layer such as silicon dioxide over the entire rear surface of the silicon wafer or substrate. Thereafter, an aluminum layer is applied over the entire area and laser fired to alloy the aluminum through the dielectric into the semiconductor. The structure is then heated up to 400° C. or more to diffuse the aluminum and provide good electrical contact regions separated from the laser damage.

A further process utilized in the prior art is to provide a passivating dielectric masking layer such as silicon dioxide over the rear surface of the silicon wafer. A laser beam is then utilized to ablate holes in the silicon dioxide masking layer to pattern it. Subsequent to the patterning of the masking or passivating layer, contacts are diffused through the opening provided in the masking layer. Most dielectric masking layers are transparent in the visible range forcing the use of a UV laser for ablation to obtain sufficient absorption in the masking layer. However, the use of a UV laser is undesirable because it has relatively low power and the intense UV light causes degradation of the optics and may also cause damage to the underlying silicon wafer.

Therefore, it would be more desirable to provide a process which eliminates the expense of utilizing screen printing or photolithography and allows the utilization of laser ablation which does not cause damage to the underlying silicon.

SUMMARY OF THE INVENTION

A method of forming point contacts to the rear surface of a silicon solar cell by coating the rear surface with a masking layer and a laser absorptive layer and directing laser radiation to said surface to form openings therein, after which an appropriate doping material is applied through the openings.

DETAILED DESCRIPTION

The present invention provides an improved method of electrically contacting a surface that has been coated with at least one dielectric or passivating layer. This method provides contact to the base layer of a solar cell in such a way that the disadvantages occurring in prior art are overcome. The method of the present invention allows the manufacture of efficient solar cells on a production basis which satisfies the demands for achievement of high efficiency while utilizing currently available equipment and process flows.

Figure 1:
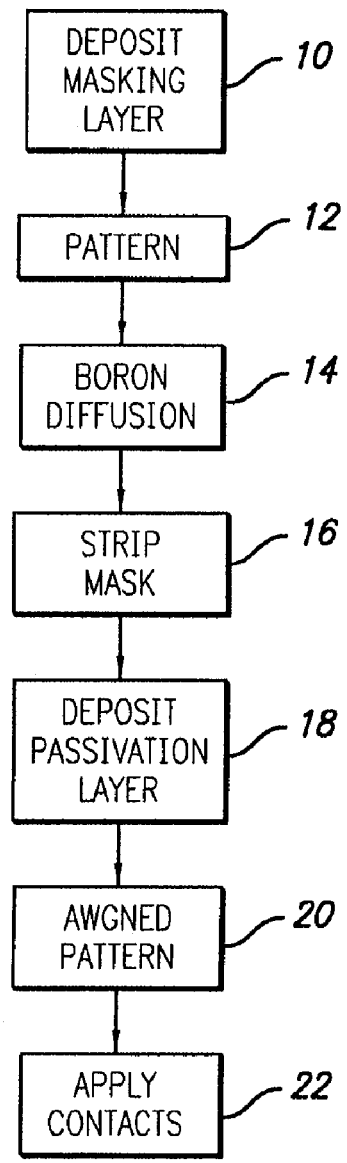
FIG. 1 is a flowchart showing the steps typically used in the prior art to form point contacts to the rear surface of a silicon solar cell.

By referring now more particularly to FIG. 1 there is shown a flowchart illustrative of the steps taken in the prior art to form a point contact to the rear or back surface of a silicon solar cell. As is well known in the art, both front and back surfaces should be coated with a passivation layer to provide a highly efficient solar cell. However, a point contact doped layer must also be formed. Thus, the first step in the prior art process would be to deposit a passivation layer on the rear surface of the solar cell substrate as is shown at 10. It is well known that to produce a point contact to the rear surface of the solar cell the masking layer must be patterned as is shown at 12. The patterning provides openings through the masking layer. Thus, for example, a layer such as silicon dioxide would be a mask to preclude the diffusion of doping atoms such as boron into a P-type silicon body, except through openings formed by way of patterning which may be accomplished by any of the well known techniques used in the prior art such as applying a photo resist, laser ablation or the like. Thereafter, boron doping atoms are diffused through the patterned openings provided in the layer as is illustrated at 14. The diffusion of the boron atoms provides a highly doped P-type region in the P-type silicon body where the openings have been provided by the patterning. Thereafter, the masking layer is stripped from the back surface of the silicon wafer or substrate as is shown at 16. Subsequent to the stripping of the mask the passivation layer is deposited as is shown at 18. Subsequent to the deposition of the passivation layer at shown at 18 an aligned patterning is produced so that openings are again provided in the redeposited passivation layer which are aligned with the highly doped regions which are formed at the time of the boron diffusion as shown at Step 14. After the aligned patterning as shown at 20 is performed, then metal contacts are applied to the highly doped P-type regions as shown at 22. As will be apparent to those skilled in the art, a plurality of steps are required in order to provide the back point contacts in accordance with the typical prior art process.

Figure 2:
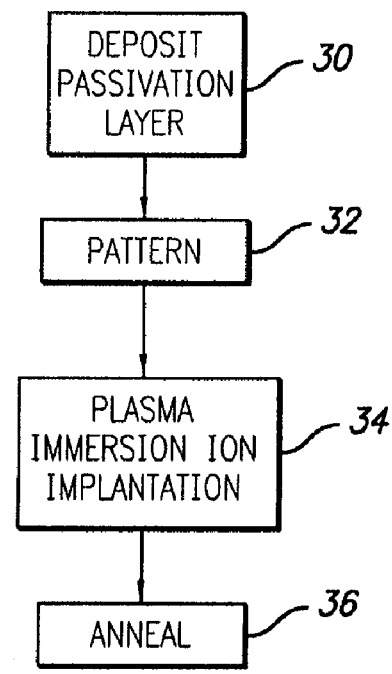
FIG. 2 is a flowchart illustrative of the method of the present invention for forming such contacts.

As in shown in FIG. 2 to which reference is hereby made, in accordance with the teachings of the present invention, the silicon semiconductor wafer or substrate has the passivation masking layer deposited thereon as is shown at 30. The passivation masking layer is then patterned as shown at 32 to provide openings therein through which doping atoms are applied to the silicon semiconductor wafer or substrate to provide the highly doped regions for providing the rear point contacts. After the patterning has been accomplished as shown at 32 boron atoms are implanted into the openings provided by the patterning step 32. Such is accomplished by utilizing plasma immersion implantation as shown at 34. To accomplish the plasma ion implantation (P3i) the silicon wafer with the patterned passivation masking layer thereon is placed in a chemical vapor deposition chamber, preferably a plasma enhanced chemical vapor deposition chamber (PECVD) of the type which is well known in the prior art. A flow of gas containing boron such for example as diborane contained within a hydrogen carrier is introduced into the chamber and an appropriate electrical energy field is produced to cause the generation of a plasma therein. The semiconductor wafer is biased to cause the ions generated within the plasma to impact the surface of the semiconductor wafer. As the boron ions impact the surface of the silicon wafer, the passivation layer functions as a mask but the boron ions are deposited through the openings provided in the mask. The plasma is continued until such time as the appropriate dose of boron ions is supplied after which the plasma is shut down. Thereafter, the semiconductor wafer with the p3i boron ions contained thereon is annealed as shown as at 36 to activate the ions and drive them into the semiconductor body to provide a highly doped P-type region to be used to provide a low resistance point contact to the back surface of the silicon solar cell.

In accordance with a preferred embodiment of the present invention, the masking layer applied to the back surface of the silicon wafer is laser ablated to form the patterning. As above pointed out, if a UV laser such as the third harmonic of a 1064 nm Nd:YVO$_4$ laser is used to ablate the masking layer damage may be caused to the underlying silicon and also degradation of the optics may occur. As a result, it would be more desirable to use a conventional laser wavelength such as 532 nm (second harmonic of Nd:YVO$_4$) which overcomes these above issues. However, conventional masking layers such as silicon dioxide and silicon nitride are transparent and would not absorb the 532 nm laser light. To overcome this problem an absorber layer is applied over the silicon dioxide layer. The absorber layer may be amorphous silicon which can be formed after the silicon dioxide layer is deposited simply by turning off the oxygen in the silicon dioxide deposition. Alternatively, the absorber layer may be amorphous carbon. The black amorphous carbon absorbs the laser light uniformly independent of the pattern. Such a layer can be formed simply by shutting off the flow of gas forming the silicon dioxide layer and inserting methane in its place.

Figure 3:
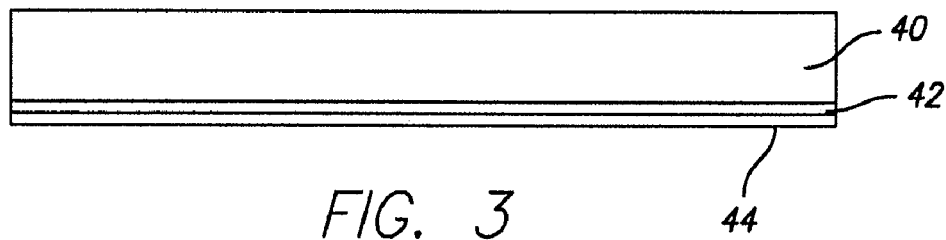
FIG. 3 shows a semiconductor body with a passivating masking layer and absorber layer applied.

By reference now to FIG. 3 there is shown a silicon semiconductor wafer 40 which includes a passivating or masking layer 42 such as silicon dioxide and an absorber layer 44 deposited on the passivating or masking layer 42. Through the utilization of the absorber layer 44 contact holes in the dielectric masking layer 42 may be formed using a conventional laser with visible or infrared wavelength longer than 360 nm. The silicon dioxide layer may be deposited in a plasma utilizing a PECVD chamber using the plasma decomposition of silane ($SH_4$) in an oxygen ambient. Similar processes are available using other precursors but the principle is the same. If the oxygen flow is eliminated amorphous silicon will be deposited over the silicon dioxide layer. Thus by a simple change of the gas flow it is possible to deposit two layers sequentially. Amorphous silicon is highly absorptive for wavelengths greater than about 0.68 microns; therefore, such a layer would be highly absorptive at a wavelength of 532 nm. As above pointed out, simply by turning off the oxygen and silane and substituting methane ($CH_4$) would result in plasma deposition of carbon. Carbon is highly absorptive at a wide range of visible and IR wavelengths again enabling use of a laser having a wavelength of 532 nm or 1064 nm.

Figure 4:
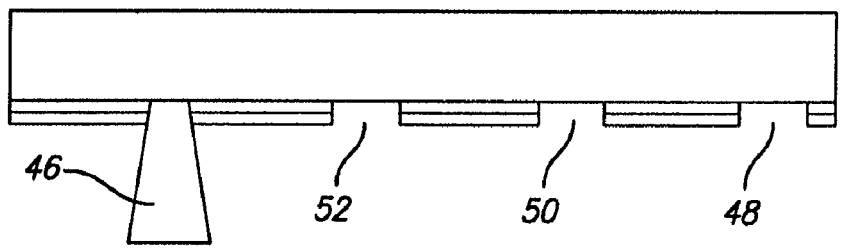
FIG. 4 shows the body of FIG. 3 being patterned by laser ablation.
Figure 5:
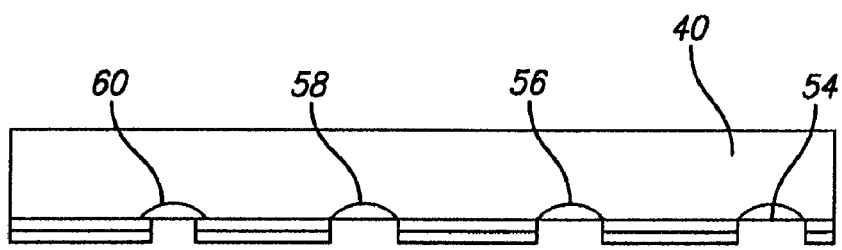
FIG. 5 shows the structure of FIG. 4 after diffusion through the patterned mask.

As is shown in FIG. 4 to which reference is hereby made after the two layers for passivation and absorption are deposited as shown in FIG. 3 a laser beam as shown schematically at 46 is focused onto the absorption layer. Because of the absorption layer 44 the laser energy ablates the absorption layer and the passivating layer 42 thus creating holes in the two layers as shown at 48, 50 and 52. The body with the holes such as 48, 50, 52 and the one being formed by the laser beam 46 is then subjected to a source of doping atoms to cause the formation highly doped P-type regions 54, 56, 58 and 60 in the P-type body 40. The highly doped regions 54-60 may be formed either by diffusion as is well known in the prior art or by utilization of the P3i process as above described. As above indicated, if the P3i process is utilized to ion implant the boron atoms into the surface of the body 40 through the openings 48 through 52 then the semiconductor wafer must be annealed to drive the atoms into the body and make them electrically active. Thereafter, electrical contacts are applied to make low resistance point contacts to the back surface of the semiconductor wafer 40. However, if diffusion is used to dope the substrate, a film may be formed in the contact holes that must first be etches away due to reactions between the dopant gasses and residual oxygen in the deposition furnace. Such a film will not form with plasma implantation and annealing.

In accordance with an alternative embodiment of the method of the present invention, the back surface field may be provided simultaneously with the highly doped region such as illustrated by reference to FIG. 6.

Figure 6:
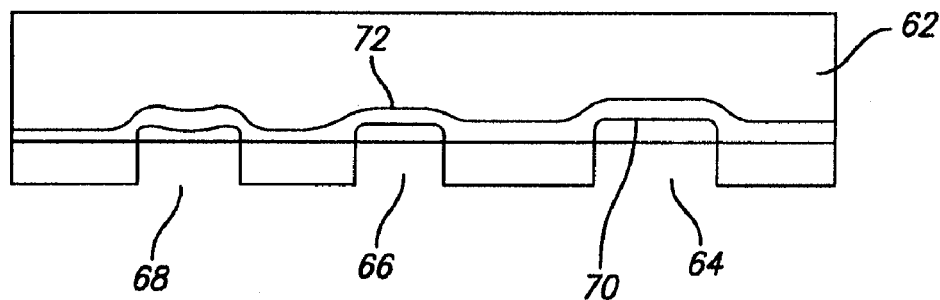
FIG. 6 is an alternative structure to that of FIG. 5 illustrating formation of the heavily doped region for forming the contact as well as more lightly doped region forming the back surface field.

As is shown in FIG. 6 the semiconductor body 62 which is formed of P-type silicon would have the holes 64, 66 and 68 formed therein as by laser ablation as above referred to. Through utilization of the P3i process both boron and arsenic atoms would be ion implanted therein using diborane (5%) and arsine (5%) in a hydrogen carrier gas. After such occurs and after annealing, the highly doped region as shown at 70 would be provided by the arsenic atoms while the back surface field would be provided by the diffusion of the boron atoms as shown at 72. Such would occur because the boron atoms have a smaller atomic mass (11) than does the arsenic atoms (75) and both are ion implanted at the same energy level thus the boron atoms travel through the masking layer and into the body of the semiconductor wafer while the arsenic atoms are blocked by the masking layer except for the openings. Such a process requires proper selection of the passivation oxide thickness. For example, a 50 Å oxide will stop a 3 kV arsenic atom, but not a boron atom of similar energy. Modeling programs such as SRIM are available as freeware to provide such calculations. In an alternate embodiment, the masking oxide is made sufficiently thick that both Boron and Arsenic atoms are stopped. However, because Arsenic is a slower diffuser than Boron in silicon dioxide, after the activation anneal the boron will form a junction in the semiconductor but the arsenic will remain in the oxide, where it is electrically inactive.

Figure 7:
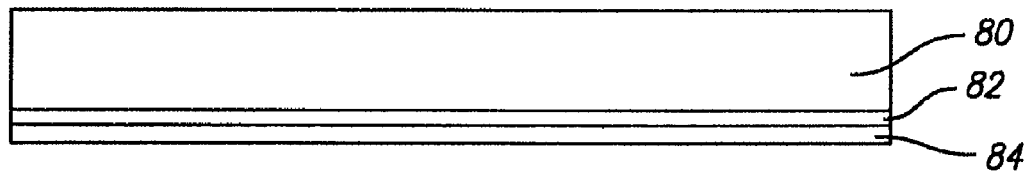
FIG. 7 shows a structure like that of FIG. 3.
Figure 8:
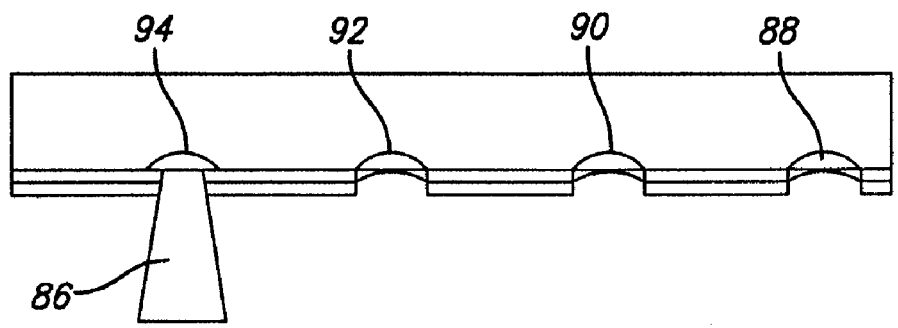
FIG. 8 shows the structure of FIG. 7 after contact regions are formed utilizing laser energy to melt the structure.
Figure 9:
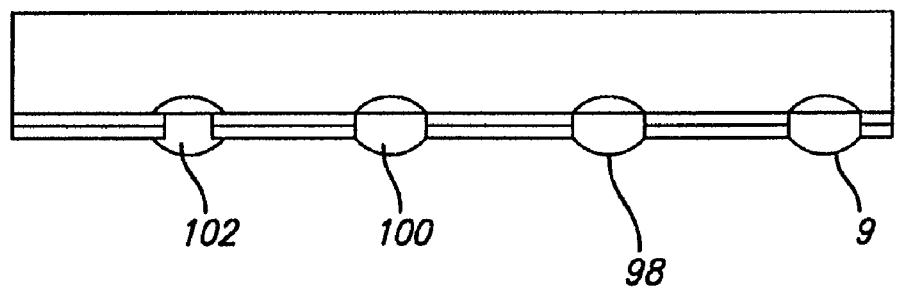
FIG. 9 shows the structure of FIG. 8 with appropriate metal contacts applied to the highly doped regions.

By referring to FIGS. 7, 8 and 9 an alternative embodiment for forming the highly doped regions to provide point contact to the back surface of the semi-conductor wafer is illustrated. As is therein shown the wafer 80 includes the passivating layer 82 provided thereon as above described followed by the absorber layer 84. The passivating layer 82 may be formed by a plasma as above referred to and at the same time may have included therein doping elements such as arsenic or boron assuming that the semiconductor wafer 80 is P-type. If such is done the silicon dioxide passivating layer 82 would be heavily doped much above the solid solubility of the underlying silicon wafer 80. In accordance with this embodiment of the present invention, the laser power as shown at 86 in FIG. 8 is increased to melt the passivating layer 82 and the silicon near the surface of the wafer 80 as is illustrated at 88, 90, 92 and 94. The dopant material then mixes in the melt to achieve a high doping level. The doping atoms may then be diffused from the melt region to form a lower doped junction and to move the junction edge away from the damage at the edge of the melt region. This forms an ideal high/low junction with high doping for the contact and low doping at the junction.

As in shown in FIG. 9 a metal contact 96, 98, 100 and 102 is then applied to the highly doped region to provide the low resistance point contact to the back surface of the semiconductor wafer 80.

There has thus been disclosed a method for forming a low resistance point contact to the back surface of a silicon semiconductor solar cell.

What is claimed is:

1. A method of forming a point contact on a surface of a silicon wafer forming a solar cell comprising:
   (a) providing a passivating layer on said surface;
   (b) providing an absorptive layer on said passivating layer;
   (c) directing laser energy to selected regions of said absorptive layer to form openings in said absorptive layers and said passivating layer;
   (d) applying doping atoms through said openings to provide highly doped regions in said silicon wafer; and
   (e) forming electrical contact to said highly doped regions.

2. The method of claim 1 wherein the absorptive layer is opaque to the wavelength of the laser energy.

3. The method of claim 1 wherein said passivating layers is silicon dioxide and said absorptive layer is amorphous silicon.

4. The method of claim 1 wherein said doping atoms are boron.

5. The method of claim 1 wherein said doping atoms are arsenic.

6. The method of claim 1 wherein said doping atoms are phosphorous.

7. The method of claim 1 wherein said doping atoms are arsenic and boron applied simultaneously.

8. The method of claim 2 wherein the laser wavelength is longer than 360 nm.

9. The method of claim 3 wherein said passivating layer is silicon dioxide and said absorptive layer is carbon.

10. The method of claim 3 wherein said absorptive layer is formed as a part of a deposition sequence by changing constituent components of the deposition.

11. The method of claim 4 wherein said doping atoms are applied by plasma immersion ion implantation.

12. The method of claim 4 wherein the laser energy is of sufficient intensity to melt the passivating layer, the surface of the underlying silicon wafer, or both.

13. The method of forming a point contact on a surface of a silicon wafer forming a solar cell comprising:
   (a) depositing a dielectric layer on said surface by a plasma deposition;
   (b) providing a source of laser energy having a predetermined wavelength;
   (c) depositing a layer of material on said dielectric layer which layer of material is opaque to the wavelength of said source of laser energy;
   (d) focusing laser energy from said source thereof to selected regions of said layer of material to form openings in said layer of material and in said dielectric layer;
   (e) subjecting said wafer with said openings to a plasma containing doping ions of the same conductivity type as that of said silicon wafer to implant ions in said surface of said silicon wafer;
   (f) annealing said silicon wafer to activate said doping atoms and form a highly doped region in said silicon wafer; and
   (g) forming electrical contacts to said highly doped regions.

14. The method of claim 13 wherein said dielectric layer is silicon dioxide and said layer of material is amorphous silicon.

15. The method of claim 13 wherein said doping atoms are boron.

16. The method of claim 13 wherein said doping atoms are arsenic.

17. The method of claim 13 wherein said doping atoms are phosphorous.

18. The method of claim 13 wherein said doping atoms are boron and arsenic applied simultaneously.

19. The method of claim 14 wherein said dielectric layer is silicon dioxide and said layer of material is carbon.

20. A method of forming a point contact on a surface of a silicon wafer forming a solar cell comprising:
   (a) providing a passivating layer on said surface;
   (b) forming openings said passivating layer at preselected regions thereof;
   (c) simultaneously applying p-type and n-type doping atoms through said openings to provide highly doped regions in said silicon wafer; and
   (d) forming electrical contact to said highly doped regions.

* * * * *